United States Patent [19]
Takahashi et al.

[11] Patent Number: 5,387,816
[45] Date of Patent: Feb. 7, 1995

[54] HYBRID INTEGRATED CIRCUIT DEVICE

[75] Inventors: Mitsuo Takahashi; Toshiaki Yagura, both of Aichi; Kyozo Yamada, Tokyo, all of Japan

[73] Assignees: Nippondenso Co., Ltd., Kariya; Taiyo Yuden Co., Ltd., Tokyo, both of Japan

[21] Appl. No.: 46,100

[22] Filed: Apr. 12, 1993

[30] Foreign Application Priority Data

Apr. 11, 1992 [JP] Japan .................................. 4-030848

[51] Int. Cl.⁶ .............................................. H01L 23/16
[52] U.S. Cl. ................................... 257/723; 257/726; 361/785
[58] Field of Search ............... 257/723, 725, 692, 726; 361/785

[56] References Cited

U.S. PATENT DOCUMENTS

| 4,241,381 | 12/1980 | Cobaugh et al. | 361/785 |
| 5,144,532 | 9/1992 | Wessely et al. | 257/723 |

FOREIGN PATENT DOCUMENTS

| 59-92595 | 5/1984 | Japan . |
| 59-149082 | 8/1984 | Japan . |
| 59-149083 | 8/1984 | Japan . |
| 61-17768 | 2/1986 | Japan . |
| 61-180495 | 8/1986 | Japan . |
| 62-89394 | 10/1989 | Japan . |
| 1-146574 | 10/1989 | Japan . |
| 3-61372 | 6/1991 | Japan . |
| 3-257990 | 11/1991 | Japan . |

OTHER PUBLICATIONS

Journal of Nippondenso Technical Disclosure, 40–411, Published on Nov. 15, 1984.

*Primary Examiner*—Robert P. Limanek
*Assistant Examiner*—Roy Potter
*Attorney, Agent, or Firm*—Flynn, Thiel, Boutell & Tanis

[57] ABSTRACT

A pedestal 11 is attached to a circuit substrate 1 having a component placement area 4 when clamping portions 12 and 12 of the pedestal 11 clamp both side portions 5 and 5 of the component placement area 4. It is possible to stand the hybrid integrated circuit device on a parent circuit substrate a by itself before the hybrid integrated circuit device is soldered to the parent circuit substrate a. Since the bottom surfaces of the clamping portions 12 and 12 are flat. The circuit substrates 1, 1, ... do not overlap one another when the hybrid integrated circuit devices are accommodated in and arranged vertically in a stick since the thickness of the clamping portions 12 and 12 of the pedestal 11 is thicker than the circuit substrate 1. Accordingly, the hybrid integrated circuit device is liable to vertically stand on the parent circuit substrate a by itself and it is easily accommodated in and taken out from the stick.

16 Claims, 3 Drawing Sheets

HYBRID INTEGRATED CIRCUIT DEVICE

BACKGROUND OF THE INVENTION

1. Field of the Invention

The present invention relates to a hybrid integrated circuit device comprising a circuit substrate having an insulating substrate on which a wiring pattern is formed, circuit components which are mounted on the circuit substrate and lead terminals which protrude from one side of the circuit substrate in a given interval.

2. Prior Art

A well-known conventional hybrid integrated circuit device comprises a circuit substrate having an insulating substrate made of ceramics, glasses or epoxy resins on which a wiring pattern is formed, circuit components which are placed on the circuit substrate and lead terminals which protrude from the circuit substrate in a given interval. Particularly, in a single inline type (SIL type) hybrid integrated circuit device, the lead terminals protrude from one side of the circuit substrate.

The hybrid integrated circuit device having the arrangement set forth above is mounted on a parent circuit substrate which constitutes another circuit device. The SIL type hybrid integrated circuit device is mounted on the parent circuit substrate with the lead terminals thereof facing the parent circuit substrate. That is, the parent circuit substrate are perforated to form through holes in conformity with the intervals of lead terminals of the circuit substrate wherein the lead terminals are inserted into the through holes of the parent circuit substrate and the lead terminals are soldered to solder lands which are formed around the through holes.

Before the lead terminals are inserted into the through holes of the parent circuit substrate and are soldered to the solder lands, fine lead terminals are engaged in the through holes. As a result, the SIL type hybrid integrated circuit device is liable to fall down so that it is unstable and the lead terminals are liable to be bent. In this state, if the lead terminals are soldered to the solder lands of the parent circuit substrate, the connection between the circuit substrate and the parent circuit substrate by way of the lead terminals are liable to be unstable.

In view of the background as set forth above, there is proposed a clamping device for standing the SIL type hybrid integrated circuit device on the parent circuit substrate by itself. Such a clamping device is disclosed in Japanese Utility Model Laid-Open Publication No. 1-146574 and is denoted at a numeral 21 as illustrated in FIG. 5. The clamping device 21 is formed by inwardly bending the tip ends of a plate-shaped member which is folded in a substantial U-shape and further bending the tip end edges in substantial L-shapes. A through hole b is formed on the flat surface of the clamping device 21 in conformity with intervals of lead terminals 3 of the hybrid integrated circuit device and the lead terminal 3 is inserted into the through hole b and thereafter a circuit substrate 1 is clamped by the clamping device 21 at both sides thereof. Successively, the lead terminal 3 is inserted into the through hole b of a parent circuit substrate a while the flat surface of the clamping device 21 is mounted on the upper surface of the parent circuit substrate a whereby the circuit substrate 1 is allowed to stand on the parent circuit substrate a by itself. At this state, the lead terminal 3 of the circuit substrate 1 is soldered to a solder land c which is formed around the through hole b of the parent circuit substrate a.

However, a the hybrid integrated circuit device using such a clamping device has the following problems. That is, the hybrid integrated circuit device having an insulating resin package on the surface of the circuit substrate 1 has no large concave and convex portion on the surface thereof. However, according to the hybrid integrated circuit board having no insulating resin package on the surface of the circuit substrate 1 has concave and convex portions owing to the circuit components 2, 2 . . . which are placed on the circuit substrate 1 as shown in FIG. 5. Accordingly, the circuit substrate 1 is unstably clamped by the tip end edges of the clamping device 21. Furthermore, the circuit components 2, 2 . . . which are placed on the circuit substrate are liable to be damaged by the pressure and friction when they are clamped by the tip end edges of the clamping device 21.

Furthermore, the hybrid integrated circuit device is usually accommodated in a sheath-shaped stick so that the circuit substrate 1 is arranged vertically and is fed to the step where the circuit substrate 1 is mounted on the parent substrate. In this case, if the clamping device 21 is used, there is a likelihood that the tip end of a neighboring circuit substrate 1 will be clamped between the tip end edges of the clamping device 21 and the circuit substrate 1, which makes the hybrid integrated circuit device difficult to be moved in the stick or to be taken out from the stick. Whereas, if the hybrid integrated circuit device alone is accommodated in the stick without using the clamping device 21, there occurs such a problem that the end edges of the neighboring circuit substrates 1 overlap each other whereby the stick is crammed with the hybrid integrated circuit devices and the hybrid integrated circuit device is difficult to take out from the stick.

SUMMARY OF THE INVENTION

It is, therefore, an object of the present invention to provide a hybrid integrated circuit device which can easily stand on the parent circuit substrate by itself and which can be easily accommodated in and taken out from a stick.

To achieve the above object, the hybrid integrated circuit device according to the present invention comprises a circuit substrate on which a wiring pattern is formed, circuit components which are placed on the circuit substrate and lead terminals which protrude from one side of the circuit substrate, said hybrid integrated circuit device further comprises a pedestal which is provided at the side where the lead terminals protrude from the circuit substrate, said pedestal comprising a pair of thick clamping portions for clamping both end portions outside a component placement area of said circuit substrate and long through holes which are defined between the clamping portions for inserting the lead terminals wherein the bottom surfaces of the clamping portions are flat.

PREFERRED EMBODIMENT OF THE INVENTION

A hybrid integrated circuit device according to a preferred embodiment of the present invention will be described with reference to FIGS. 1 to 4.

The hybrid integrate circuit device comprises a circuit substrate 1 and a pedestal 11 for supporting the circuit substrate 1.

Figure 1:
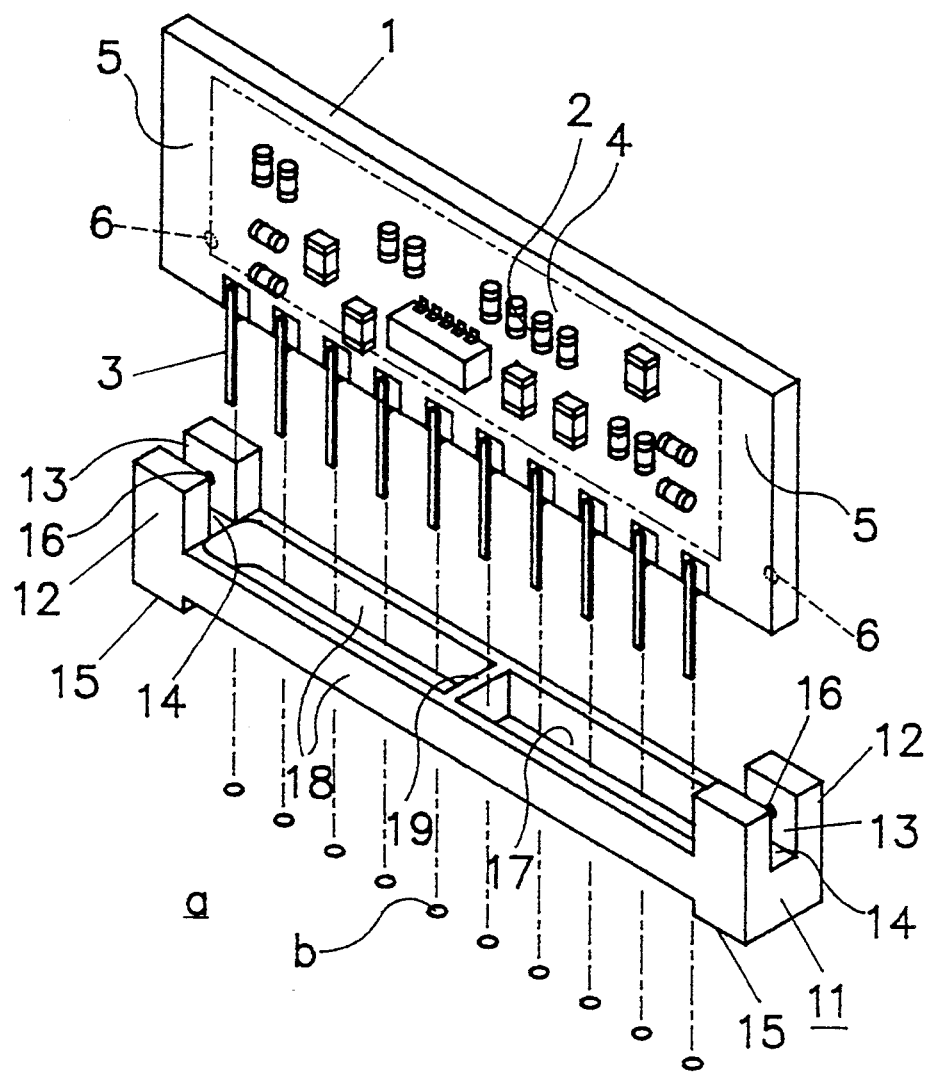
FIG. 1 is an exploded perspective view of a hybrid integrated circuit device wherein basic components of the hybrid integrated circuit device are placed on a circuit substrate.

The circuit substrate 1 comprises an insulating substrate made of ceramics, glasses or epoxy resins and a thick film printing material such as a metal paste, resistant paste, etc. is printed on the insulating substrate and sintered to thereby form a given wiring pattern. Circuit components 2 are placed on a component placement area 4 of the circuit substrate 1 to thereby constitute an electronic circuit. Lead terminals 3 for inputting data to and outputting data from the electronic circuit are attached to the circuit substrate 1 at one side thereof in given intervals and they project downward as illustrated in FIG. 1. Positioning holes 6 and 6 are formed at given positions at the lower surface of the side portions 5 and 5 which are located outside the component placement area 4 of the circuit substrate 1. The positioning holes 6 and 6 may be holes formed on both side surfaces of the circuit substrate 1 or may be through holes formed by perforating both side surfaces of the circuit substrate 1.

The pedestal 11 has the same length as that of the circuit substrate 1 and comprises clamping portions 12 and 12 disposed at both ends thereof, a long parallel pair of connecting portions 18 and 18 for connecting the clamping portions 12 and 12, a reinforcing portion 19 positioned at the middle of the connecting portions 18 and 18 for partitioning the connecting portions 18 and 18 into two long through holes.

The clamping portions 12 and 12 are cubical and have grooves 13 and 13 which are defined therebetween and open upward. An axis of one clamping portion 12 is positioned along the line extending from an axis of the other clamping portion 12. The widths of the grooves 13 and 13 are slightly wider than the thickness of the circuit substrate 1 and the widths of the through holes 17 and 17 are slightly wider than those of the grooves 13 and 13. Bottom surfaces 14 and 14 of the grooves 13 and 13 substantially flush with the upper surfaces of the connecting portions 18 and 18. Protrusions 16 and 16 are provided at one of the inner side surfaces of the clamping portions 12 and 12 at the position corresponding to the holes 6 and 6 of the circuit substrate 1. If the positioning holes 6 and 6 are those formed on both side surfaces of the circuit substrate 1, the protrusions 16 and 16 are provided at confronted both inner side surfaces of the clamping portions 12 and 12. Bottom surfaces 15 and 15 of the clamping portions 12 and 12 are lower than the bottom surface of the connecting portions 18 and 18 whereby there is the difference in level between the connecting portions 18 and 18 and the clamping portions 12 and 12.

The pedestal 11 is mounted on the lower side of the circuit substrate 1. That is, the lower portions of the both side portions 5 and 5 of the circuit substrate 1 which are positioned outside the component placement area 4 are engaged in the grooves 13 and 13 of the clamping portions 12 and 12 and thereafter the lead terminal 3 and 3 are allowed to penetrate the through holes 17 and 17 to protrude downward. At this time, the protrusions 16 and 16 provided at the inner wall surfaces of the grooves 13 and 13 of the clamping portions 12 and 12 are held by the holes 6 and 6 of the circuit substrate 1 so that the pedestal 11 is attached to the circuit substrate 1 at a given position. That is, the pedestal 11 is mounted on the substrate 1 in the manner that the both side portions 5 and 5 of the substrate 4 are engaged in the grooves 13 and 13 until the edge surface of the substrate 4 from which the lead terminals 3 protrude reaches the bottom surfaces 14 and 14 of the grooves 13 and 13 of the clamping portions 12 and 12 and the end surfaces of the circuit substrate 1 are allowed to lush with the end surfaces of the pedestal 11. The reinforcing portion 19 provided at the middle of the connecting portions 18 and 18 strikes against the lower edge surface of the circuit substrate 1 between the lead terminals 3 which are positioned at the central portion of the circuit substrate 1 and supports the middle portion of the circuit substrate 1 from the lower portion thereof.

Figure 4:
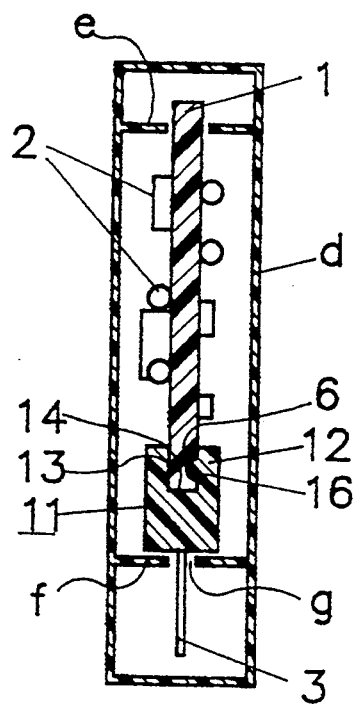
FIG. 4 is a longitudinal cross-sectional view of the hybrid integrated circuit device which is accommodated in a stick.
Figure 5:
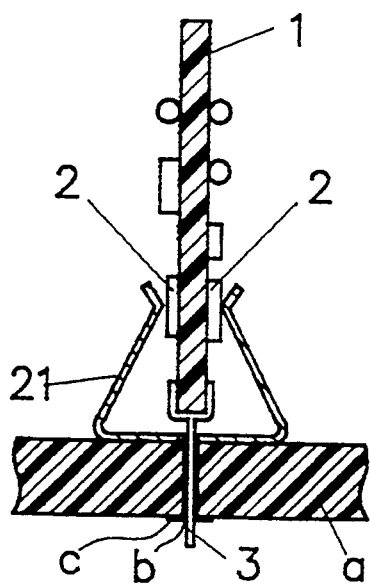
FIG. 5 is a longitudinal cross-sectional view of a conventional hybrid integrated circuit device wherein a circuit substrate is mounted on a parent substrate.

The assembled hybrid integrated circuit device is accommodated and kept in a long sheath-shaped stick d and conveyed by the stick d as illustrated in FIG. 4. The stick d is rectangular in cross section and the inner dimensions of the height and width of the stick d are slightly greater than the height, and width of the hybrid integrated circuit device. Substrate presser ribs e protrude from the inner upper surface of the stick d and are confronted with each other at the interval which is slightly wider than the width of the circuit substrate 1. The upper portion of the circuit substrate 1 thus accommodated in the stick d is held between the substrate presser ribs e. The stick d has a double structured bottom plate at the lower portion thereof and the pedestal 11 of the hybrid integrated circuit device accommodated in the stick d is placed on an upper bottom plate f wherein the lead terminals 3 penetrate slits g of the upper bottom plate f and protrude downward from the upper bottom plate f.

Figure 2:
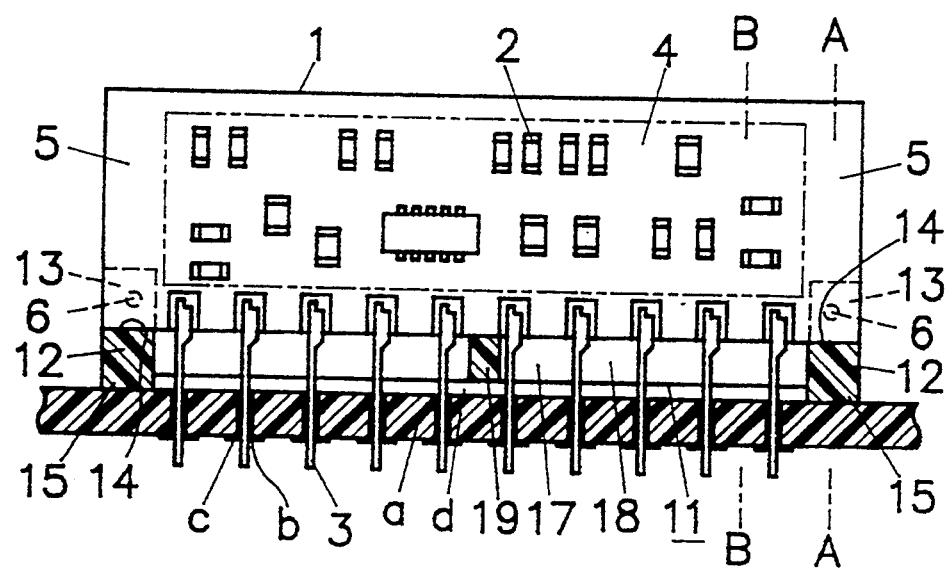
FIG. 2 is a front view of the hybrid integrated circuit device of FIG. 1 wherein the circuit substrate is mounted on a parent substrate and a pedestal is broken at the center thereof.
Figure 3:
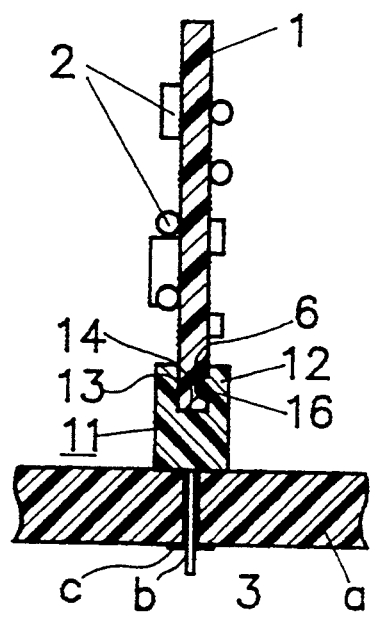
FIG. 3(a) is a side cross-sectional view taken along the line A—A of FIG. 2.
FIG. 3(b) is a side cross-sectional view taken along the line B—B of FIG. 2.
Figure 3:
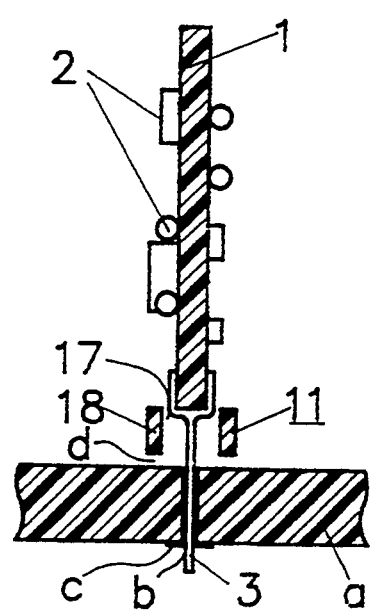

In order to place the hybrid integrated circuit device on a parent circuit substrate a, the hybrid integrated circuit device is taken out from the stick d as illustrated in FIGS. 2 and 3 and thereafter the bottom surfaces 15 of the clamping portions 12 and 12 are mounted on the parent circuit substrate a and successively the lead terminals 3 protruding from the through holes 17 of the pedestal 11 are inserted into the through holes b of the parent circuit substrate a. At this state, the pedestal 11 is mounted stably on the parent circuit substrate a whereby the circuit substrate 1 stands on the parent circuit substrate a by itself. Successively, the tip end of the lead terminals 3 are soldered on the solder lands c which are provided around the through holes b of the parent circuit substrate a. At this time, gaps d are defined between the connecting portions 18 and 18 and the parent circuit substrate a owing to the difference in levels, i.e., between the heights of the clamping portions 12 and 12 and the connecting portions 18 and 18 as illustrated in FIG. 2 and FIG. 3(b) so that gas, which is emitted from the fused solder at the time of soldering the lead terminal 3, can escape. As a result, a solder bridge, etc. which are generated between the lead terminals 3 can be prevented.

While the hybrid integrated circuit device has been described with reference to FIGS. 1 to 4 as the preferred embodiment, this description is not intended to be construed in a limiting sense. It is a matter of course that various modifications can be made. For example, the bottom surfaces 15 and 15 of the clamping portions 12 and 12 of the pedestal 11 are flush with the bottom surfaces of the connecting portions 18 and 18 in case there is no likelihood of generating the problem owing to the emission of the gas although the bottom surfaces 15 and 15 of the clamping portions 12 and 12 of the pedestal 11 are lower than the bottom surfaces of the connecting portions 18 and 18 so as to let off the gas emitted from the fused solder by defining the gas d when the hybrid integrated circuit device is mounted on the parent circuit substrate a. Furthermore, if the length of the through holes 17 are short, it is not always necessary to provide the reinforcing portion 19 at the middle of the connecting portions 18 and 18. Whereas, if the length of the through holes 17 are long, a plurality of reinforcing portions 19 may be provided at appropriate intervals.

What is claimed is:

1. A hybrid integrated circuit device comprising a circuit substrate on which a wiring pattern is formed, circuit components which are placed on a component area of the circuit substrate and lead terminals which protrude from one side of the circuit substrate, said hybrid integrated circuit device further comprising;

a pedestal which is provided at the side where the lead terminals protrude from the circuit substrate, said pedestal comprising a pair of thick clamping portions for clamping both end portions of said substrate outside the component placement area of said circuit substrate, a pair of connecting portions for connecting the clamping portions and having through holes which are defined between the clamping portions and the connecting portions for inserting the lead terminals wherein the bottom surfaces of the clamping portions are fiat.

2. A hybrid integrated circuit device according to claim 1, wherein said clamping portions of the pedestal have protrusions at inner wall surfaces thereof and the side surface of the circuit substrate have positioning holes so that the protrusions engage into the positioning holes.

3. A hybrid integrated circuit device according to claim 1, wherein the pedestal has a reinforcing portion at the middle portion of the through holes, said reinforcing portion being integrated with the connecting portion so as to bridge over the connecting portions.

4. A hybrid integrated circuit device according to claim 1, wherein the bottom surfaces of the clamping portions of said pedestal are lower than the bottom surfaces of the connecting portions.

5. A hybrid integrated circuit device according to claim 4, wherein said clamping portions of the pedestal have protrusions at inner wall surfaces thereof and the side surface of the circuit substrate have positioning holes so that the protrusions engage into the positioning holes.

6. A hybrid integrated circuit device according to claim 4, wherein the pedestal has a reinforcing portion at the middle portion of the through holes, said reinforcing portion being integrated with the connecting portion so as to bridge over the connecting portions.

7. An apparatus, comprising: a circuit substrate having a wiring pattern thereon, having electrical components mounted thereon and electrically coupled to said wiring pattern, and having a plurality of elongate and electrically conductive lead terminals which are mounted on and project outwardly from said substrate and which are electrically coupled to said wiring pattern; and a pedestal which is physically separate from and detachably coupled to said substrate, said pedestal having on a first side thereof clamping means for gripping said substrate to detachably couple said pedestal to said substrate, having on a second side thereof opposite from said first side means defining a substantially flat surface, and having a through hole which extends therethrough from said first side to said second side, wherein when said substrate is detachably coupled to said pedestal by said clamping means, said terminals extend completely through said through hole and project beyond said flat surface.

8. An apparatus according to claim 7, wherein said terminals extend through said through hole free of contact with said pedestal.

9. An apparatus according to claim 7, wherein said pedestal is a single integral part made completely of an electrically non-conductive material.

10. An apparatus according to claim 7, wherein said substrate has spaced first and second portions which are free of said components, wherein said clamping means includes spaced first and second clamping sections which respectively grip said first and second portions of said substrate, wherein said means defining said surface includes spaced first and second surface portions which are substantially flat, and wherein said through hole is located between said first and second clamping sections and between said first and second surface portions.

11. An apparatus according to claim 10, wherein said circuit substrate has a plurality of elongate and electrically conductive further lead terminals which are mounted on and project outwardly from said substrate and which are electrically coupled to said wiring pattern, and wherein said pedestal has a further through hole which extends therethrough from said first side to said second side at a location between said first and second clamping sections and between said first and second surface portions, wherein when said substrate is detachably coupled to said pedestal, said further lead terminals extend completely through said further through hole and project beyond said first and second surface portions.

12. An apparatus according to claim 10, wherein said first and second portions of said substrate each have a positioning hole therein, and wherein said first and second clamping sections each include spaced clamping portions disposed on opposite sides of said substrate, one of said clamping portions of each said clamping section having thereon a protrusion which engages a respective said positioning hole.

13. An apparatus according to claim 10, wherein said first and second surface portions are substantially coplanar, and wherein said pedestal has on said second side thereof a further surface portion disposed between said first and second surface portions, said through hole opening through said further surface portion, and said further surface portion being closer to said substrate than each of said first and second surface portions.

14. An apparatus according to claim 13, wherein said further surface portion is substantially planar, and extends substantially parallel to said first and second surface portions.

15. An apparatus according to claim 13, including a further circuit substrate having a surface disposed against said first and second surface portions of said pedestal and having therein a plurality of holes which each receive therein an end portion of a respective said lead terminal.

16. An apparatus according to claim 7, including an elongate stick part having an opening extending therein to and having a first pair of spaced flanges which project toward each other from opposite sides of said opening and a second pair of spaced flanges which project toward each other from said opposite sides of said opening, said circuit substrate and said pedestal detachably coupled to said substrate being slidably received within said opening in said stick part, said lead terminals being disposed between said first pair of flanges and said first and second surface portions on said pedestal each being adjacent inner edge portions of said first pair of flanges, and an edge portion of said circuit substrate on a side thereof remote from said pedestal being disposed between inner ends of said second pair of flanges.

* * * * *

UNITED STATES PATENT AND TRADEMARK OFFICE
CERTIFICATE OF CORRECTION

PATENT NO. : 5,387,816
DATED : February 7, 1995
INVENTOR(S) : Mitsuo TAKAHASHI, et al.

It is certified that error appears in the above-indentified patent and that said Letters Patent is hereby corrected as shown below:

Column 5, line 45; change "fiat" to ---flat---.

Signed and Sealed this

Fifth Day of September, 1995

Attest:

BRUCE LEHMAN

Attesting Officer

Commissioner of Patents and Trademarks